(12) United States Patent
Kimoto

(10) Patent No.: US 8,493,086 B2
(45) Date of Patent: Jul. 23, 2013

(54) ELECTRICAL SIGNAL CONNECTOR

(76) Inventor: Gunsei Kimoto, Tokyo (JP)

(*) Notice: Subject to any disclaimer, the term of this patent is extended or adjusted under 35 U.S.C. 154(b) by 89 days.

(21) Appl. No.: 12/478,087

(22) Filed: Jun. 4, 2009

(65) Prior Publication Data

US 2010/0026327 A1    Feb. 4, 2010

(30) Foreign Application Priority Data

Jun. 4, 2008  (JP) ................................. 2008-172784

(51) Int. Cl.
*G01R 1/067*   (2006.01)

(52) U.S. Cl.
USPC ............ 324/755.01; 324/756.03; 324/756.04; 324/754.03; 324/754.07; 439/66; 439/482

(58) Field of Classification Search
USPC ............ 324/756.03–756.04, 755.01, 754.03, 324/754.07; 439/66, 482
See application file for complete search history.

(56) References Cited

U.S. PATENT DOCUMENTS

| | | | | |
|---|---|---|---|---|
| 6,326,688 | B1* | 12/2001 | Ochiai | 257/731 |
| 7,255,575 | B2* | 8/2007 | Hasegawa | 439/71 |
| 7,622,937 | B2 | 11/2009 | Kimoto | |
| 2002/0153913 | A1* | 10/2002 | Okubo et al. | 324/761 |
| 2007/0252608 | A1* | 11/2007 | Koizumi et al. | 324/754 |
| 2008/0048698 | A1* | 2/2008 | Amemiya et al. | 324/758 |
| 2008/0116920 | A1* | 5/2008 | Kimoto | 324/758 |
| 2009/0261850 | A1* | 10/2009 | Kim | 324/754 |

FOREIGN PATENT DOCUMENTS

JP    2009-36745 A    2/2009

* cited by examiner

*Primary Examiner* — Arleen M Vazquez
(74) *Attorney, Agent, or Firm* — Browdy and Neimark, PLLC

(57) ABSTRACT

An electrical signal connector which may be used for testing narrow-pitched chips or multi-chips, and causes no faulty connections between probes and pads or between probes and a circuit board even in a high temperature environment such as in a burn-in test is provided. The electrical signal connector has a probe unit in which a plurality of resin-made film probes, corresponding to one or more pads on a semiconductor chip to be tested, are supported in parallel on a plurality of support plates; a first probe holder of grid structure provided with a plurality of openings; and a second probe holder of the same configuration as that of the first probe holder, the second probe holder having projections at intersection points in the grid structure. The first and second probe holders are fastened to the circuit board with the projections of the second probe holder inserted in corresponding holes of the circuit board and the first probe holder being fastened to the circuit board with screws. No or very little difference exists between an outer diameter of an inserting section of the projection and an inner diameter of the corresponding hole in the circuit board in the vicinity of the center of the circuit board and larger difference exists therebetween in the rest of areas of the circuit board.

6 Claims, 14 Drawing Sheets

(a)

(b)

US 8,493,086 B2

ELECTRICAL SIGNAL CONNECTOR

BACKGROUND OF THE INVENTION

1. Field of the Invention

The present invention relates to a prober unit for testing circuits of semiconductor chips on a semiconductor wafer in the manufacturing process of electronic devices including LSI. More particularly, the present invention relates to an electrical signal connector which includes a probe assembly of a prober apparatus for use in a probing test. In the probing test, circuit terminals (i.e., pads) arranged on the semiconductor chips on a wafer are made to contact with vertical probes for collective measurement of electrical conductivity of the semiconductor chips.

2. Description of the Related Art

As the semiconductor technology advances, electronic devices have become more highly integrated and a circuit wiring area has increased in each wafer chip. Pads on each wafer chip have also increased in number, and have become more precisely arranged, whereby pad areas become smaller and pad pitches becomes narrower. The pad pitch will become as narrow as 20 μm in the near future.

Chip size packaging (CSP) becomes dominant in which a bear, non-packaged chip is mounted on a circuit board or other substrate In fabricating the CSP, characteristics and quality of the chips should be verified at the wafer level. In an exemplary inspection process, a contact element assembly is disposed between test equipment and pads on semiconductor chips.

The contact element assembly includes needle probes each having a section which is elastically deformable due to external force. A printed circuit board called probe card is used for electrically connecting the contact element assembly and test circuits on the semiconductor chips.

The section of the probe card that interfaces with the test head of the test equipment should have compatibility in shape and pitches with those of the test head. At the same time, the section of the probe card near the probes and in contact with the wafer should have compatibility in shape and pitches with those of the chip pad.

A multilayer substrate may be used for converting pitches of closely arranged wirings near the probes into wider pitches of the terminals on the circuit board of the test head.

FIGS. 6 to 14 illustrate an exemplary configuration of a probe card proposed by the present applicant before the filing date of the present application. FIG. 15 shows an exemplary probe card of the related art which includes a probe card 7 and card substrate 71 to be connected to a test head. A chip 81 to be tested is shown in a perspective view to illustrate its positional relationship with the card substrate 71. Terminals 72 arranged at the periphery of the card substrate 71 interface with a test head (not shown) of test equipment. The terminals 72 include sections that have compatibility in shape and pitch with those of the test head.

Probes 91 are attached by a probe alignment fixing device 92 so as to correspond to terminal pads 82 on the chip 81 to be tested on the wafer 8. The probe alignment fixing device 92 can be selected depending on the probe type. A cantilever type probe alignment fixing device 92 may be used for directly soldering the probes 91 to the circuit board. A probe sheet type probe alignment fixing device 92 may include a sheet member such as an electric insulating film having parallel belt-like wirings formed on one side thereof, and a part of the wiring is used as a probe element. An example is shown in Japanese Unexamined Patent Application Publication (JP-A) No. 2001-183392.

As the chips become more highly-integrated and narrow-pitched, wiring patterns at the periphery of the probe become more and more closely arranged. As the chips become more highly-integrated and narrow-pitched, wiring patterns at the periphery of the probe become more and more closely arranged. In order to finally distribute the wiring to peripheral terminals of the card substrate 71, the wiring substrate must be a multi-layer substrate having the wiring arranged densely at the periphery of the probe terminals. In a current practical patterning of a printed circuit board, about 128 to 160 wirings per signal layer is appropriate. For example, a circuit tester with about 1000 pins requires over 20 layers including a power supply layer, having thickness of 4.8 to 6.5 mm, and diameter of about 350 mm.

In terms of economical efficiency of a probe card and a standardized card substrate 71, a conversion wiring board 93 may be disposed between the probe card and the wafer so as to function as a complicated conversion wiring 94 which varies depending on the pad to be tested (See JP-A-2001-183392).

In such a related art electrical signal connector, however, the wafer may be subject to serious thermal expansion or contraction near the probes due to temperature rise. As a result, the probe contact elements and the chip pads become relatively displaced to cause some probes removed from the pad. In a multilayer substrate for wiring conversion, if the wiring from the probe is firmly connected to the multilayer substrate by means of wiring or pattern wiring, the probe and the connector may expansion coefficient in the probe and the wafer. As a result, the wafer cannot be tested any more.

In order to solve the aforementioned problems, the present inventors have proposed an improved probe card or an improved electrical signal connector incorporating the same. FIGS. 6 to 14 illustrate an exemplary configuration of a probe card proposed by the present applicant (it still has novelty at the filing date of the present application). The electrical signal connector incorporating the improved probe card will be described now with reference to the drawings.

FIG. 6 is a partially enlarged, schematic perspective view of the entire improved electrical signal connector. In FIG. 6, a semiconductor wafer 1 to be tested, a circuit board 2, a resin-made film probe 3, a probe unit 4, a probe holder 40 and a fixing frame 5 are illustrated.

A plurality of resin-made film probes 3 disposed to correspond to pads (not shown) on the semiconductor wafer 1 to be tested are supported and fixed on support rods 41 of the probe holder 40, thereby constituting a probe unit 4. In the illustrated example, a probe unit is constituted by 4×4=16 chips. The probe holder 40 includes fixing pawls 42.

The fixing frame 5 includes support materials 52 extending in the X direction and support materials 53 extending in the Y direction. The support materials 52 and 53 intersect with each other to define openings 54. The fixing frame 5 also includes fixing devices 55 provided to protrude at positions to interface with the circuit board 2.

The circuit board 2 includes terminal sections 21 for connecting to a card substrate (not shown), electric terminals (not shown) for connecting to a connecting terminal of the resin-made film probe 3, which will be described later, and holes 22 into which the fixing devices 55 are placed.

A single probe unit 4 is placed in one of the openings 54 of the fixing frame 5 and fixed there with the pawls 42. The fixing devices 55 are placed in the holes 22 of the circuit board 2. In this manner, an electrical signal connector is produced.

FIG. 7 is a cross-sectional view showing positional relationships of the components of an assembled electrical signal connector. In FIG. 7, resin-made film probes 30a, 30b and 30c correspond to pad 11a, 11b and 11c on the chip. Each probe is supported by the support rod 41, which in turn is supported by the support material 53. The fixing frame 5 is fixed to the circuit board 2 with the fixing devices 55 placed in the holes 22.

Output terminals 32, which will be described later, of the resin-made film probes are kept in contact with pads 23 on the circuit board 2. A probe tip 31 of the resin-made film probe contacts with, for example, the pad 11a for inspection.

Referring to FIG. 8A and subsequent drawings, components will be described in detail.

First, a structure and a method of manufacturing a resin-made film probe 300 will be described in detail with reference to FIG. 9. As shown in FIG. 8A, metallic foil (e.g., beryllium copper foil, hereinafter referred to as "copper foil") is attached to a resin film (e.g., polyimide resin) 301. The copper film is then etched to form a conductive pattern 302. Parallel beams 303-1 to 303-n and slits 304-1 to 304-m of the conductive pattern 302 altogether constitute link mechanisms. The resin-made film probe 300 also includes a cut-out portion 305. With this structure, probing operation can be conducted due to the spring force in the Z direction.

Parallel springs herein move in parallel in the Z direction in an X, Y, and Z orthogonal coordinate system within a certain range with first ends fixed and second ends moved. The parallel springs include substantially identically-shaped beams parallel-arranged and fixed on a common non-deformable support at both ends of the beams. In this embodiment with a fixed part 306 and a vertical probe 307, overdrive acts in the −Z direction.

A rotating deforming part 308 is connected to a tip of the vertical probe 307. When the pad begins contact with the probe tip 310 of the rotating deforming part, overdrive acts to push the probe tip 310 up in a certain amount. Then, the rotating deforming part 308 begins rotating clockwise about a rotational center 309 and scrubbing action begins.

An output terminal 311 is provided to protrude from the resin film 301 in an extension of the fixed portion 306. The output terminal 311 is pressed against an electric terminal pad on the circuit board due to the spring force from a structure of the arm 312 and the notch 305.

As shown in FIG. 8B, each of the output terminals 311 may be positioned in a shifted manner by an amount of T1 or T2, for example, in accordance with the position of the corresponding electrical terminal on the circuit board. Probes of different configurations may be etched on a single resin film and then cut into pieces. In this manner, probes of different configuration can be provided at low cost.

A reinforcement section 313 may be suitably provided by printing a sheet of insulating resin on the resin film 301. Thus, rigidity required for the resin-made film probe can be ensured, or alternatively, required electric insulation can be provided.

A cut-out 314 of almost the length of the support rod 41 along the Z direction in the X, Y and Z orthogonal coordination system of the probe holder 40 is provided to allow aligned fixation with the support rod 41.

The resin-made film probes shown in FIG. 8 are stacked or parallel-arranged to form a probe assembly as shown in FIG. 9. FIG. 9 illustrates in detail a structure of the probe assembly corresponding to a chip.

A probe assembly 350 is a group of probes corresponding to a chip 101 to be tested. FIG. 9 shows a relationship between a chip pad and a contact pad of the circuit board. Components for holding the probes are not illustrated in FIG. 9.

The resin-made film probes 300 having the structure shown in FIG. 8 are aligned with and fixed to the corresponding chip pads 111a and 111b. In this manner, a probe group corresponding to the chips to be tested 101 is provided.

The resin-made film probes may be aligned by, for example, using an alignment sheet 6 shown in FIG. 9. The alignment sheet 6 is formed from a resin film 601 in which slits 611a and 611b are formed to correspond to the pads such as chip pads 111a and 111b. Each of the slits 611a and 611b has a width that is the same as or slightly narrower than the pad. The probes are accurately aligned with the pads with the vicinity of the probe tips placed within the slits.

The output terminals 311 may be provided at separate positions so that output positions of the output terminals 311 can be determined depending on the design pattern of the pads 23 on the circuit board 2.

FIG. 10 shows a structure of a probe holder 40. As shown in FIG. 10A, the probe holder 40 includes a support rod 401 for supporting the probes 300 and a support plate 402 for fixing support rods in an aligned manner. The support rods 401 are fixed by the support plate 402. The probes 300 are mounted from the opening side of the support rods 401 and supported. As shown in FIG. 10B, the probe holder 40 also includes pawls 403 and 404 for fixing the probe holder 40 to the fixing frame 5.

FIG. 11 shows the structure of the fixing frame 5 and its relationship with the probe unit 4. The fixing frame 5 includes support materials 520 extending in the X direction, and support materials 530 extending in the Y direction. The support materials 520 and 530 intersect with each other to define openings 540. The fixing frame 5 also includes fixing devices 550 provided to protrude at positions to interface with the circuit board 2. Each probe unit 4 is placed and fixed in one of the openings 540.

The support material 520 may be made of a material having a thermal expansion coefficient similar to that of the semiconductor wafer (e.g., Fe-36Ni alloy) so as to eliminate the influence of elasticity due to thermal expansion.

FIG. 12A shows a structure of a fixing device of the fixing frame 5. Here, differently-shaped fixing devices 550A and 550B are illustrated. In FIG. 12B, fixing devices are inserted in the circuit board 2.

In FIGS. 12A and 12B, the fixing device 550A includes slits to generate spring force in the X direction. Under a condition in which no spring force is exerted, the width D1 of an end portion 562 of the fixing device 550A is slightly larger than the inner diameter of the hole (for example, through hole) 201 in the circuit board in which the end portion 562 is inserted. The width d1 of the inserting portion 563 is slightly smaller than the inner diameter of the hole 201.

When the fixing device 550A begins insertion in the hole 201, the end portion 562 contracts inward at the slit 561. When the inserted end portion 562 passes through the hole 201, the width D1 restores its original state due to repulsive force of the spring. The end portion 562 is fixed at an end engaging portion 564.

Similarly, the fixing device 550B includes a slit 571 to generate spring force in the X direction. Under a condition in which no spring force is exerted, the width D2 of an end portion 572 of the fixing device 550B is slightly larger than the inner diameter of the hole 202, which is larger than that of the hole 201, and the width d2 of the inserting portion 573 is substantially the same as the width d1 of the inserting portion 563 of the fixing device 550A. Accordingly, the difference between the width d2 after insertion of the fixing device 550B and the inner diameter of hole 202 is larger than the difference in the fixing device 550A.

A structure of the support material with the fixing devices mounted thereon is shown in FIGS. 13A and 13B. FIG. 14A shows a support material 521 which includes both the fixing devices 550A and 550B. FIG. 14B shows a support material 522 which includes only the fixing devices 550B.

FIGS. 14A and 14B show a positional relationship of holes on the circuit board 2 and the connection pads. FIG. 14A shows a group of fixing holes 22 of FIG. 6 seen from the Z direction in the X, Y and Z orthogonal coordination system. In FIG. 14A, reference numerals 221 to 227 indicate the row number of the fixing holes. Nine holes 201 (enclosed by the dotted line) at the center of the lines 223 to 225 including the neighborhood of the center of the circuit board 2 have small inner diameters. Other holes 202 have large inner diameters.

In this case, the support materials corresponding to the circuit board 2 with fixing holes include the support materials 521 of FIG. 13 to correspond to the lines 223 to 225 and the support materials 522 to correspond to the rest of the lines.

FIG. 14B shows in detail the area 250 occupied by an opening of the fixing frame 5, i.e., by a probe unit. An area 110 shown by dotted line corresponds to a chip to be tested. The positional relationships of the resin-made film probes 300 arranged in parallel and the pads 23 corresponding to the output terminals 311 in each area 110 are shown in FIG. 14B. The resin-made film probes 300 and the pads 23 are enlarged for the purpose of illustration.

The operation and effects of the thus-structured electrical signal connector will be described below with reference to the drawings.

As shown in FIG. 6, the probe unit 4 is fixed to the fixing frame 5. Then the support materials 521 for the lines 223 to 225 and the support materials 522 for the rest of the lines are used to correspond to the fixing holes shown in FIG. 14A. In this manner, the following operation and effects are provided.

As shown in FIG. 12B, a combination of the hole 201 having small inner diameter and the support material 550A at the center of the circuit board 2 provides a reference position of the fixing frame 5. In this manner, occurrence of initial misalignment between the fixing frame 5 and the contact pads 23 of circuit board can be reduced.

In a state in which the wafer is heated such as in burn-in testing, the terminal pads come apart from the center and are located further toward the outer periphery of the wafer due to thermal expansion of the circuit board. The fixing frame 5, however, is not affected by the thermal expansion of the circuit board 2 if combinations of the holes 202 with larger inner diameter and the fixing devices 550B are provided on the circuit board 2 excluding the center thereof, and the support material is made of a material having a thermal expansion coefficient similar to that of the semiconductor wafer (e.g., Fe-36Ni alloy).

Accordingly, since the probe units 4 disposed in the fixing frame 5 and the resin-made film probes 3 mounted on the probe unit 4 are also not affected by the thermal expansion of the circuit board 2, occurrence of misalignment between the probes and the chip pads can be reduced, and thus contact failure seldom occur even in a high temperature environment.

Since the output terminals 32 of the resin-made film probes 300 are pressed against the pads 23 of the circuit board and thus are not restricted along the X-Y surface direction, the output terminals 32 cannot be broken due to thermal expansion.

Although the holes 201 and 202 are illustrated herein, holes may alternatively used of which inner diameters vary successively toward the outer periphery of the circuit board.

In the related art electrical signal connectors, relative misalignment between the probe contact portion and a chip pad as a result of expansion and contraction due to increased temperature at a portion near the probe still exists. As a result, some probes may still be removed from the pad. Rupture of the connecting section with the probe still exists due to difference in the thermal expansion coefficient with that of the wafer in a wire or pattern wiring between the multilayer substrate for wiring transformation.

SUMMARY OF THE INVENTION

In view of the aforementioned, an object of the invention is to provide an electrical signal connector used for electrical connection tests of semiconductor chips, including a test for narrow-pitched chips, a wafer test in a heating device like burn-in testing, and a collective test for multiple chips. Occurrence of misalignment between the probes and the pads due to temperature rise during these tests may be reduced. Even if misalignment occurs, faulty connection between the probes and the pads or between the probes and the circuit board may be avoided.

Another object of the invention is to provide more convenient processes to assembly the probe unit and the probe holder to the circuit board so as to reduce the number of process steps.

An aspect of the invention is an electrical signal connector which employs a resin-made film probe, the probe fabricated by: preparing a resin film with copper foil adhering thereto; etching the copper foil to form a conductive pattern of a conductive material on the resin film, the conductive pattern having a probing function; forming a section of the conductive material protruding from the resin film as a probe tip; and forming a section of the conductive material protruding from the opposite side of the probe as an output terminal to be electrically connected to a tester, the electrical signal connector including: a probe unit in which a plurality of resin-made film probes, corresponding to one or more pads on a semiconductor chip to be tested, are supported in parallel on a plurality of support plates; a first probe holder of grid structure provided with a plurality of openings; and a second probe holder of the same configuration as that of the first probe holder, the second probe holder having projections at intersection points in the grid structure, wherein each of the probe units is separately disposed in and fixed to each of the openings and the circuit board is sandwiched between the first probe holder and the second probe holder.

In another aspect of the invention, the first and second probe holders are fastened to the circuit board with the projections of the second probe holder inserted in corresponding holes of the circuit board and the first probe holder being fastened to the circuit board with screws.

In still another aspect of the invention, no or very little difference exists between an outer diameter of an inserting section of the projection and an inner diameter of the corresponding hole in the circuit board in the vicinity of the center of the circuit board and larger difference exists therebetween in the rest of areas of the circuit board.

In a further aspect of the invention, the difference between an outer diameter of an inserting section of the projection and an inner diameter of the corresponding hole in the circuit board in areas other than the vicinity of the center of the circuit board becomes successively or intermittently larger toward an outer periphery of the circuit board.

In a still further aspect of the invention, an operation of the projection in the areas other than the vicinity of the center of the circuit board is not restricted in a surface direction (i.e., an X-Y direction in an X, Y and Z orthogonal coordinate system) of the circuit board.

In yet another aspect of the invention, in a state in which the probe holders are fixed to the circuit board, the output terminal of the resin-made film probe is pressed against a terminal of the circuit board with force larger than predetermined force and an operation thereof is not restricted in the surface direction (i.e., an X-Y direction in an X, Y and Z orthogonal coordinate system) of the circuit board.

In still yet another aspect of the invention, at least the probe holders are made of a material having a thermal expansion coefficient similar to that of the semiconductor wafer.

According to the invention, an electrical signal connector used for electrical connection tests of semiconductor chips, including a test for narrow-pitched chips, a wafer test in a heating device like burn-in testing, and a collective test for multiple chips may be provided. Occurrence of misalignment between the probes and the pads due to temperature rise during these tests may be reduced. Even if misalignment occurs, faulty connection between the probes and the pads or between the probes and the circuit board may be avoided.

Since the probe unit and the probe holder may be assembled to the circuit board in a simple process of screwing, more useful test equipment may be provided and the number of process steps may be reduced.

DESCRIPTION OF THE PREFERRED EMBODIMENTS

Figure 1:
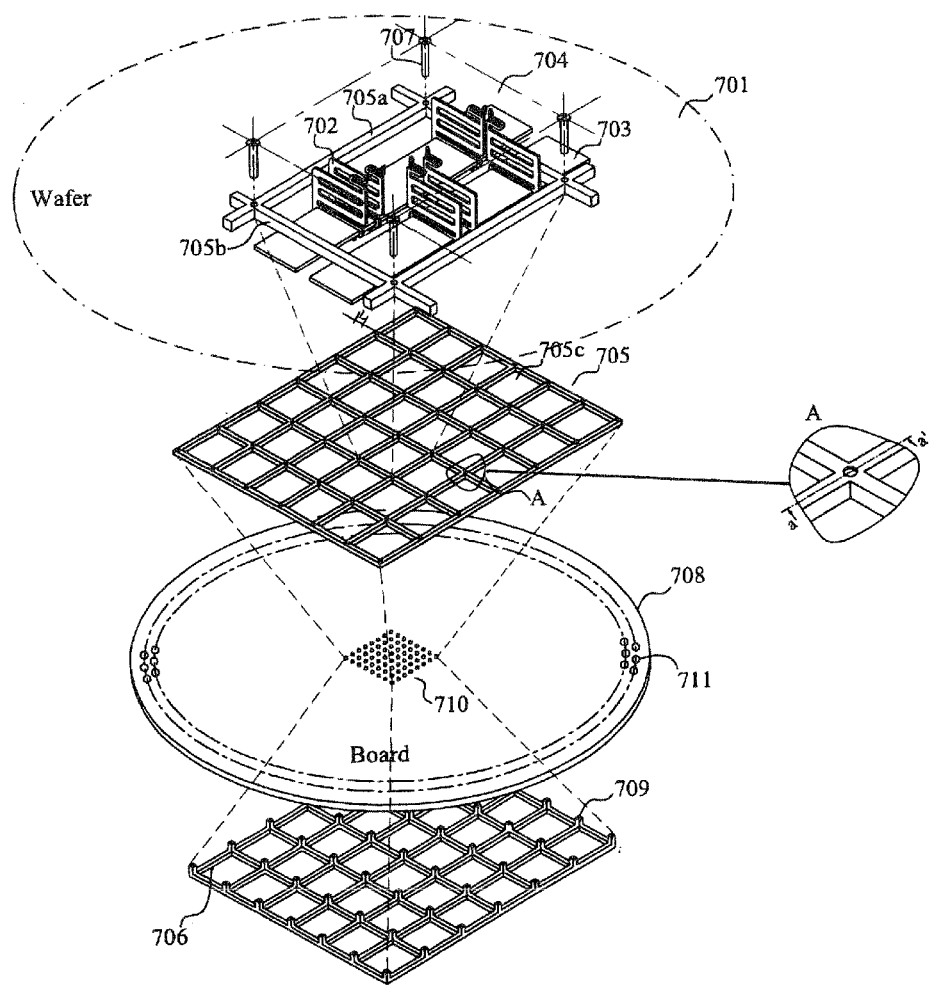
FIG. 1 is a perspective view of a structure of an electrical signal connector according to an embodiment of the invention.

Referring now to the drawings, embodiments of the invention will be described. FIG. 1 is a partially enlarged, schematic perspective view of the entire electrical signal connector according to an embodiment of the invention. In FIG. 1, a semiconductor wafer 701 to be tested, a circuit board 708, a resin-made film probe 702, a probe unit 704, a first probe holder 705, a probe support plate 703 and a second probe holder 706 are illustrated.

The resin-made film probes 702 disposed to correspond to pads (not shown) on the wafer 701 are stacked or fixed in parallel through an elongated probe support plate 703 to constitute a probe unit 4. In the illustrated example, a probe unit 704 includes resin-made film probes 702 disposed to correspond to pads on chips formed on the wafer 701.

The first probe holder 705 is a frame body constituted by square bars 705a and 705b arranged in a grid pattern. As shown in an enlarged view A, a small through hole is provided at intersection points of the square bars 705a and 705b. A machine screw 707, which will be described later, is inserted in the hole. The probe support plate 703 is inserted in an elongated hole 718 shown in FIG. 5 formed in the resin-made film probe 702 such that a plurality of resin-made film probes 702 are fixed in parallel to one another. The first probe holder 705, the probe support plate 703 and the resin-made film probe 702 altogether constitute the probe unit 704.

The square bars constituting the first probe holder 705 and the second probe holder 706 have an L×L cross section, which may define intervals between adjacent probe units to the dimension of L.

The first probe holder 705 includes square bars extending in the X direction and square bars extending in the Y direction. These square bars intersect with each other to define openings 705c. Each probe unit 704 is disposed in each of the openings 705c.

The thus-assembled probe unit 704 is fixed to the second probe holder 706 via the circuit board 708. The second probe holder 706 has almost the same structure as that of the first probe holder 705 except for projections 709 provided at each of the intersection points of the square bars. Each projection 709 includes a screw hole through which the machine screw 707 is inserted. The projections 709 are aligned with the intersection points of the first probe holder 705 from behind the circuit board 708 via through holes 710. The first probe holder 705 and the second probe holder 706 are fastened to each other by the machine screws 707. The probe support plate 703 is also fixed to the circuit board 708 via output terminals 713 (see FIG. 2). In this manner, the circuit board 708 is sandwiched between the first probe holder 705 and the second probe holder 706.

The circuit board 708 includes terminal sections 711, pads (see FIG. 2) and through holes 710. The terminal sections are for connection to a card substrate (not shown). The pads are connected to connection terminals of the resin-made film probes 702. The projections 709 provided in the second probe holder 706 are inserted in the through hole 710 to fix the second probe holder 706. The electrical signal connector is thus configured.

The electrical signal connector is an assembly of multiple probe units and multiple probe holders. All the components of the electrical signal connector are made of the Fe-36Ni alloy (Invar™) having small thermal expansion coefficient, which makes the electrical signal connector withstand high-temperature inspections including burn-in testing.

Figure 2:
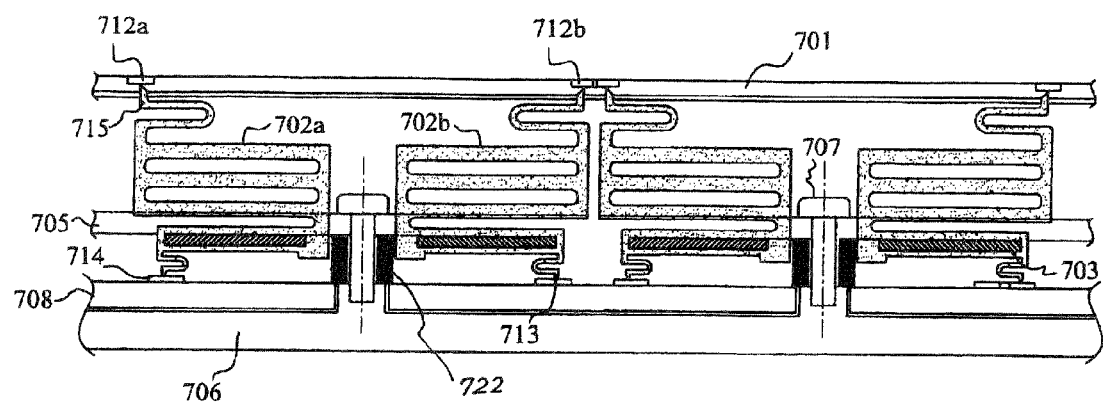
FIG. 2 is an enlarged view showing a partial cross section of FIG. 1.

FIG. 2 is a partially enlarged side view illustrating the resin-made film probes are in contact with the semiconductor wafer to be tested. In FIG. 2, resin-made film probes 702a and 702b correspond to pads 712a and 712b on the semiconductor chip. Each resin-made film probe is supported in parallel by the probe support plate 703, which in turn is supported by the first and the second probe holders 705 and 706. The second probe holder may be attached to the circuit board 708 with the projections of the second probe holder 706 inserted in the through holes provided in the circuit board 708. A spacer 722 is disposed between parallel-supported adjacent resin-made film probes 702a and 702b in order to adjust the distance between the first probe holder 705 and the circuit board 708.

The output terminals 713 of the resin-made film probes 702 are kept in contact with the pads 714 on the circuit board 708. A probe tip 715 of the resin-made film probe contacts with, for example, a chip pad 712a of the wafer 701 for inspection.

The diameter of the through holes 710 is substantially equal to that of the projection 709 in the central portion of the circuit board 708, but is gradually increased toward an outer periphery of the circuit board 708. With this configuration, the circuit board is not restrained in the X-Y direction when thermally expanded and thus influence of the thermal stress on the probe holder may be reduced. In this manner, deformation of the probe holder may be prevented and misalignment between the probe tips (715 and 713) of the probe unit 704 and the pads (712a and 714) of the semiconductor wafer 701 to be tested, and the circuit board 708 may be eliminated. Thus, the probe unit may be used in high temperature inspections.

Figure 3:
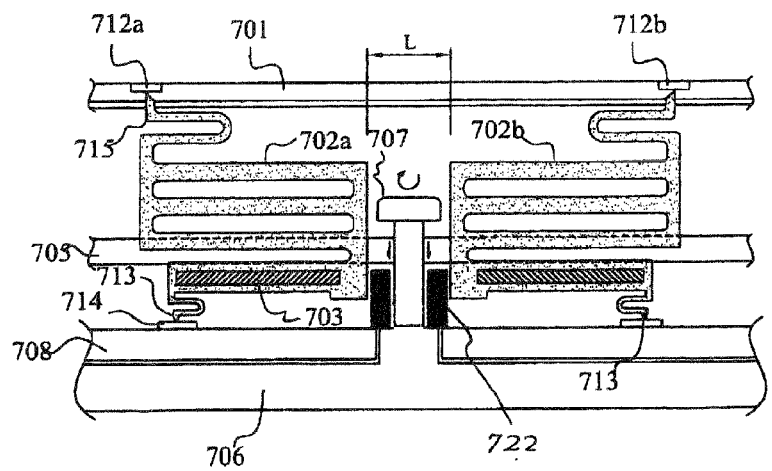
FIG. 3 is an enlarged view showing a partial cross section of FIG. 1.
Figure 4:
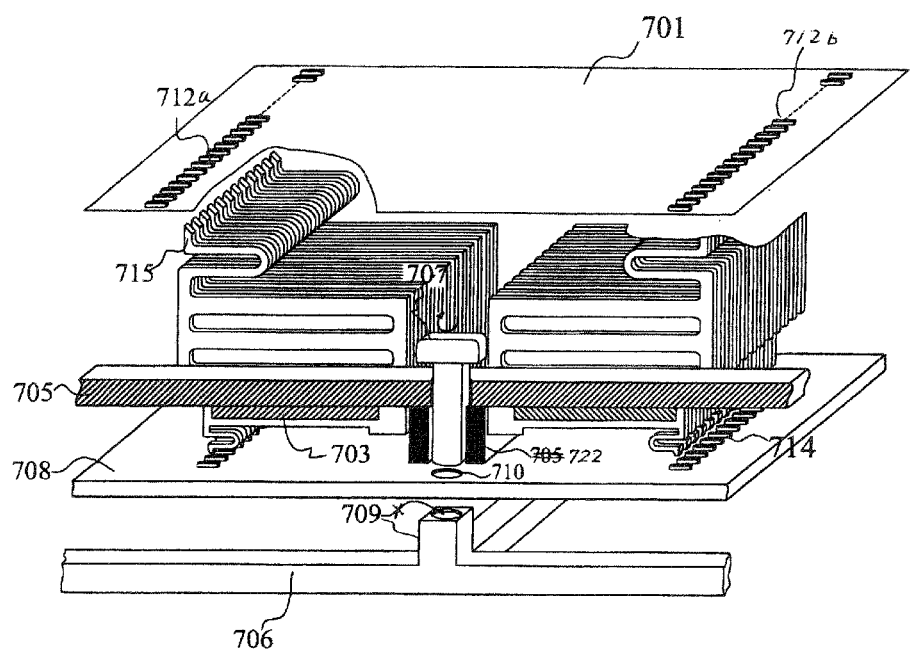
FIG. 4 is a perspective view of FIG. 3.

FIG. 2 illustrates a single probe unit corresponding to a pad array for a chip. FIG. 3 and FIG. 4, which is a perspective view of FIG. 3, illustrate probe units corresponding to pad arrays for adjacent chips. Detailed description of the configuration of the probe units will be omitted.

A configuration of the resin-made film probe 702 will be described with reference to FIG. 5. Copper foil (e.g., beryllium copper foil) is made to adhere to a resin film (e.g., a polyimide resin film). The copper film is then etched to form a conductive pattern 716. Parallel beams 719-1 to 719-3 and slits 720-1 and 720-2 of the conductive pattern 716 altogether constitute link mechanisms. The resin-made film probe 702 may also include a cut-out portion 717 and curved portion 721. With this structure, probing operation may be conducted with the spring force along the vertical direction. The reference numeral 708 represents the elongated hole through which the probe support plate 703 is inserted.

Figure 5:
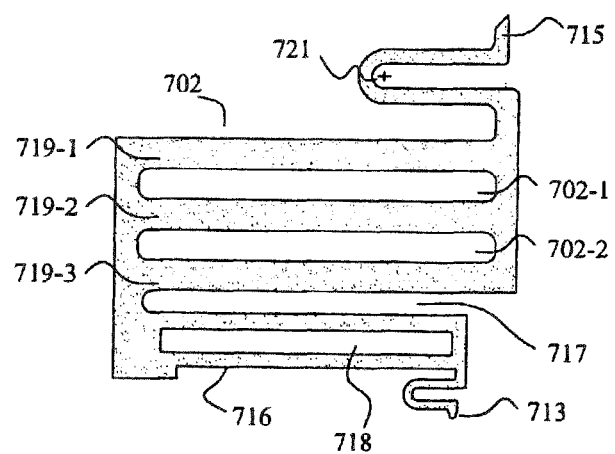
FIG. 5 is a front view of a structure of a resin-made film probe according to an embodiment of the invention.
Figure 6:
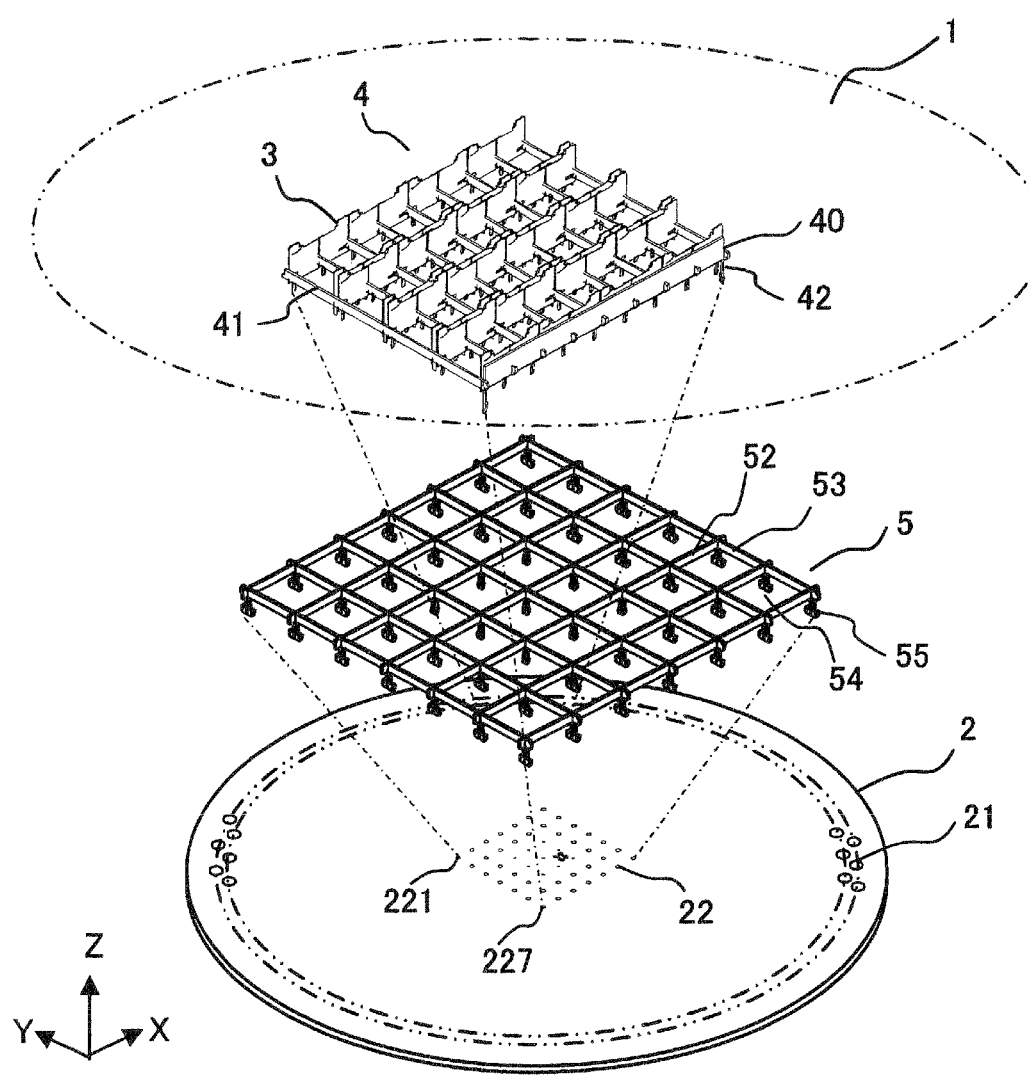
FIG. 6 is a perspective view of a structure of an electrical signal connector proposed previously by the present applicant.
Figure 7:
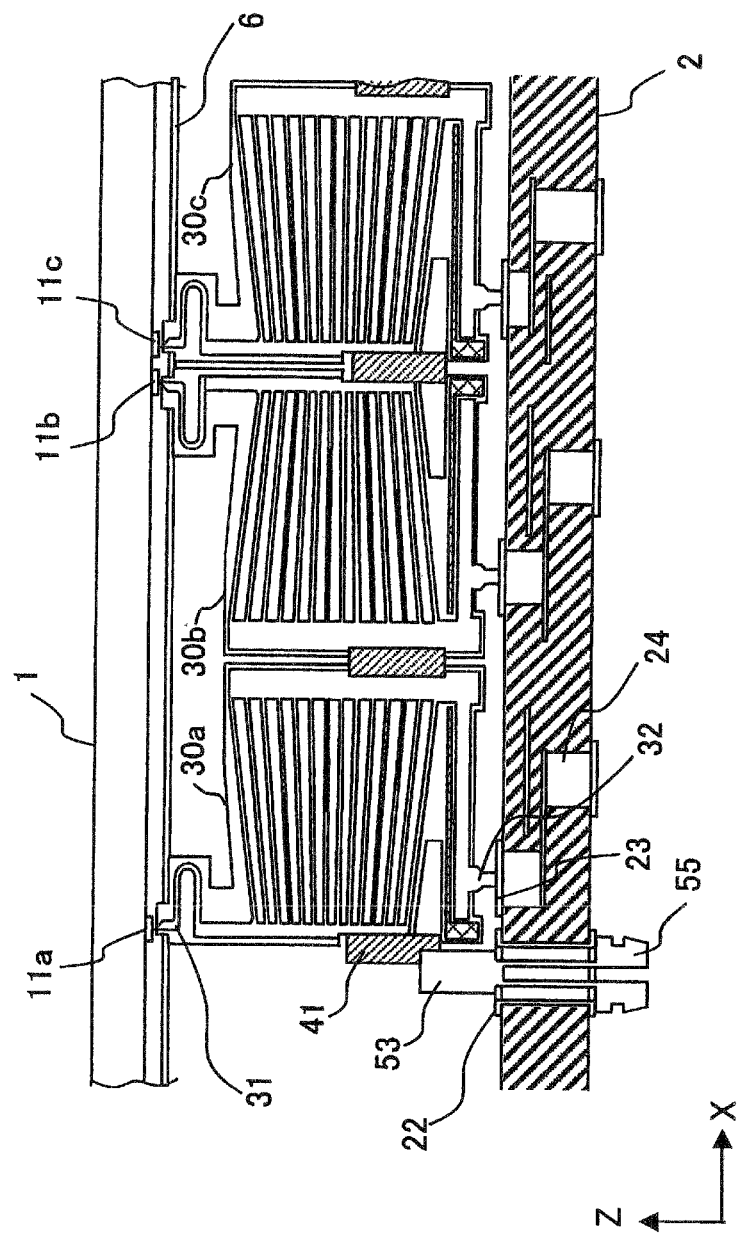
FIG. 7 is a fragmentary cross-sectional view of FIG. 6.
Figure 8:
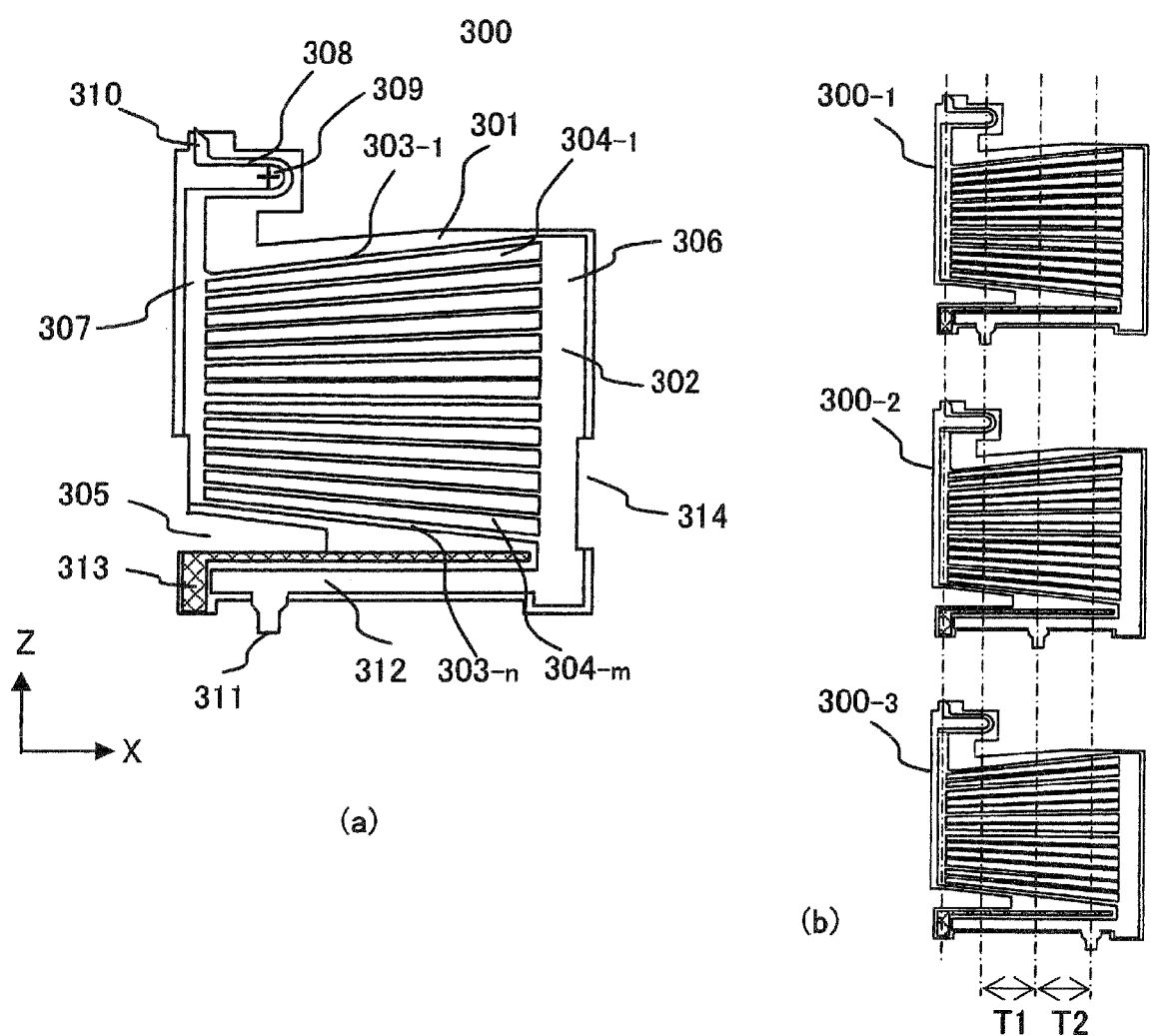
FIGS. 8A and 8B are front views of a structure of a resin-made film probe proposed previously by the present applicant.
Figure 9:
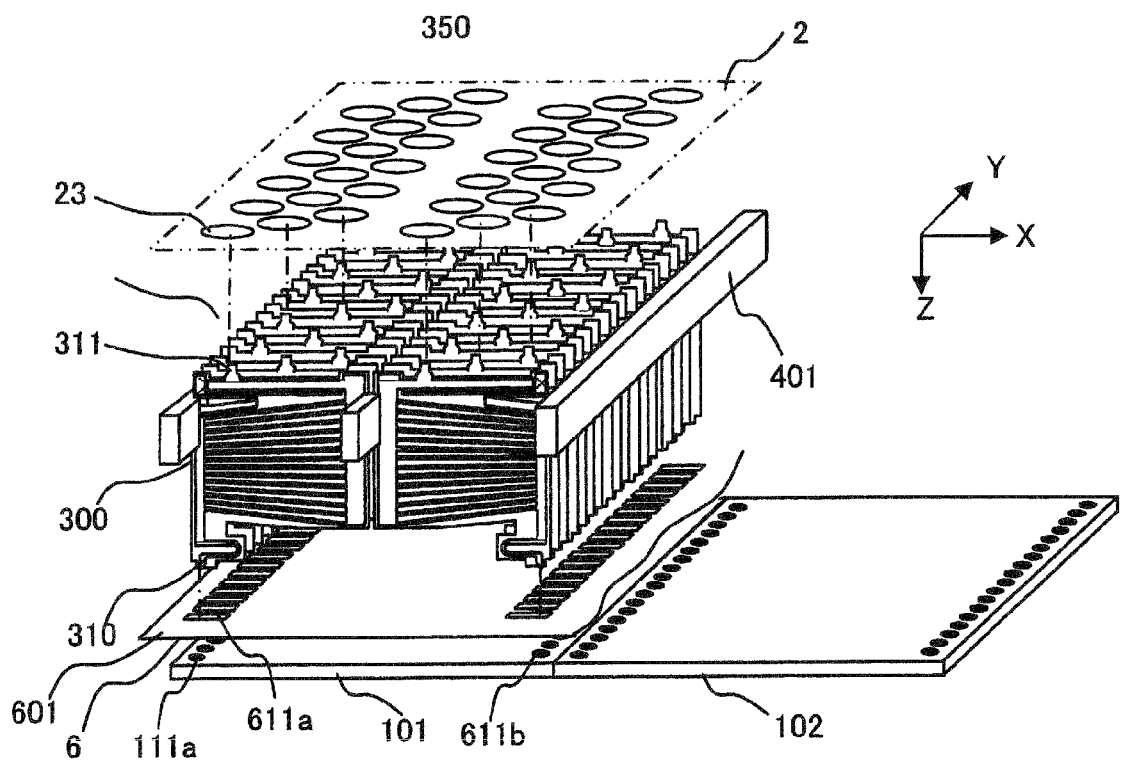
FIG. 9 is a perspective view of FIG. 7.
Figure 10:
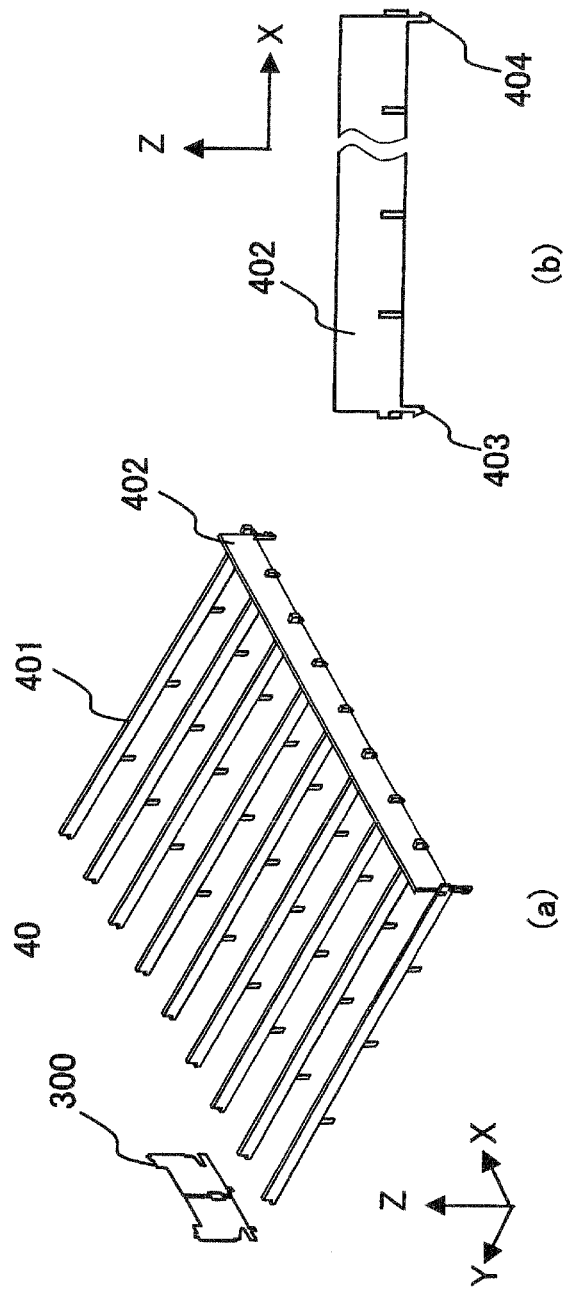
FIG. 10A is a perspective view and FIG. 10B is a front view of a structure of a probe holder according to an embodiment of the invention.
Figure 11:
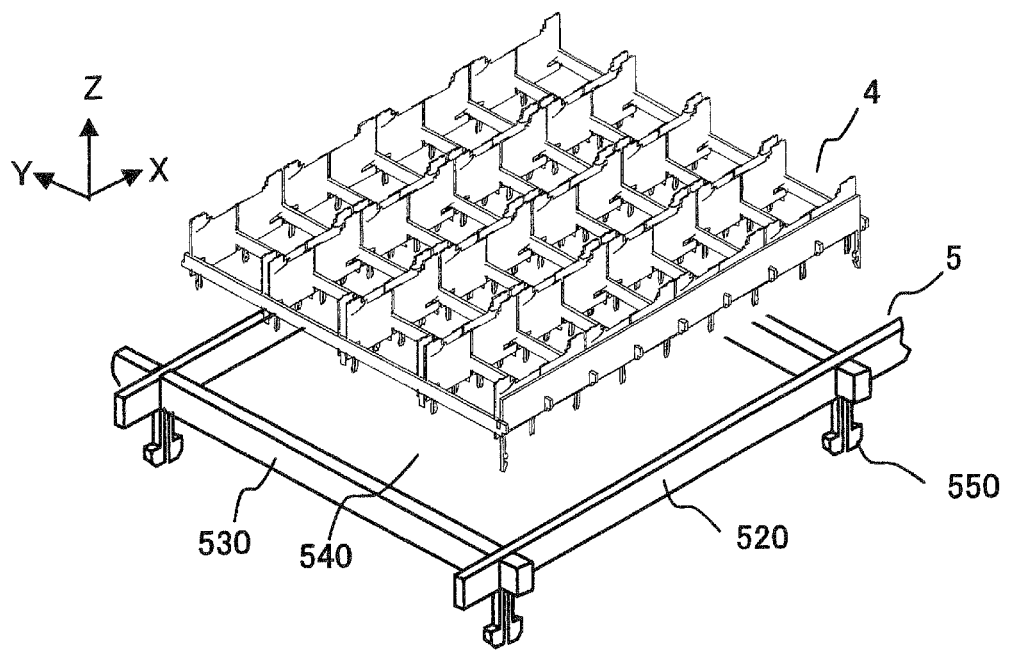
FIG. 11 illustrates a positional relationship of a probe unit and a fixing frame according to an embodiment of the invention shown in a perspective view.
Figure 12:
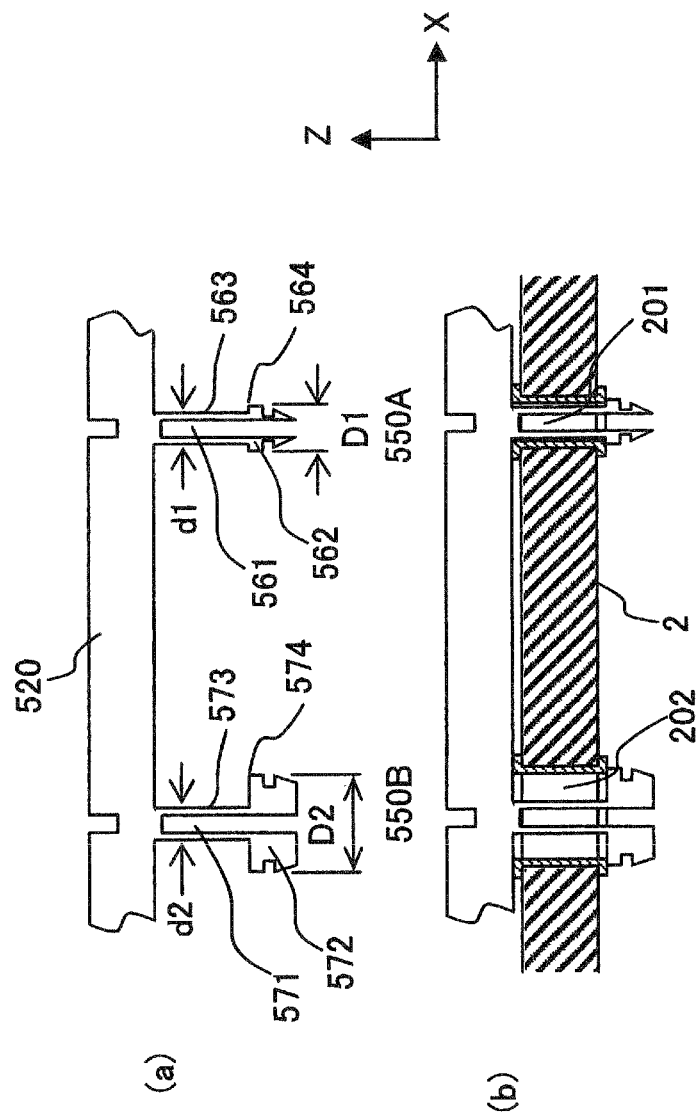
FIG. 12A is a front view and FIG. 12B is a cross-sectional view of components of a fixing frame according to an embodiment of the invention.
Figure 13:
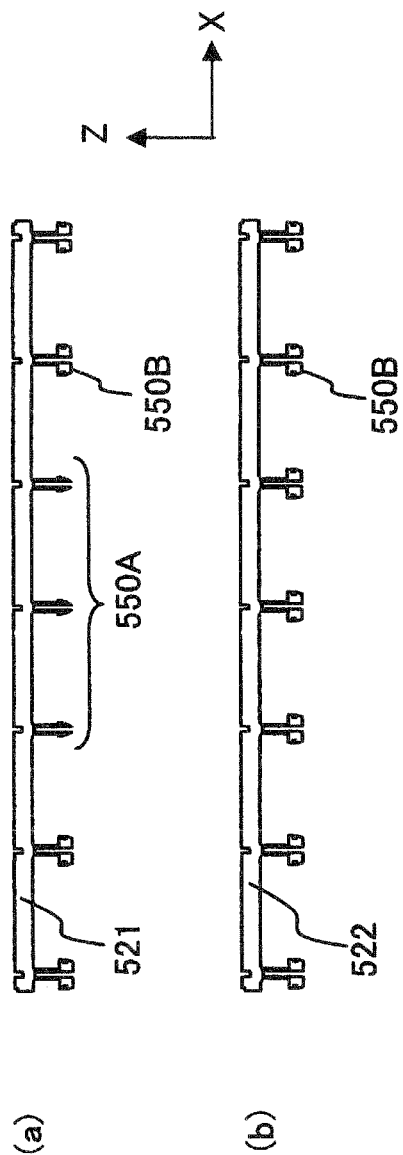
FIG. 13A is a front view of a related art fixing frame which includes both fixing devices and FIG. 13B is a front view of a related art fixing frame which includes only one fixing device.
Figure 14:
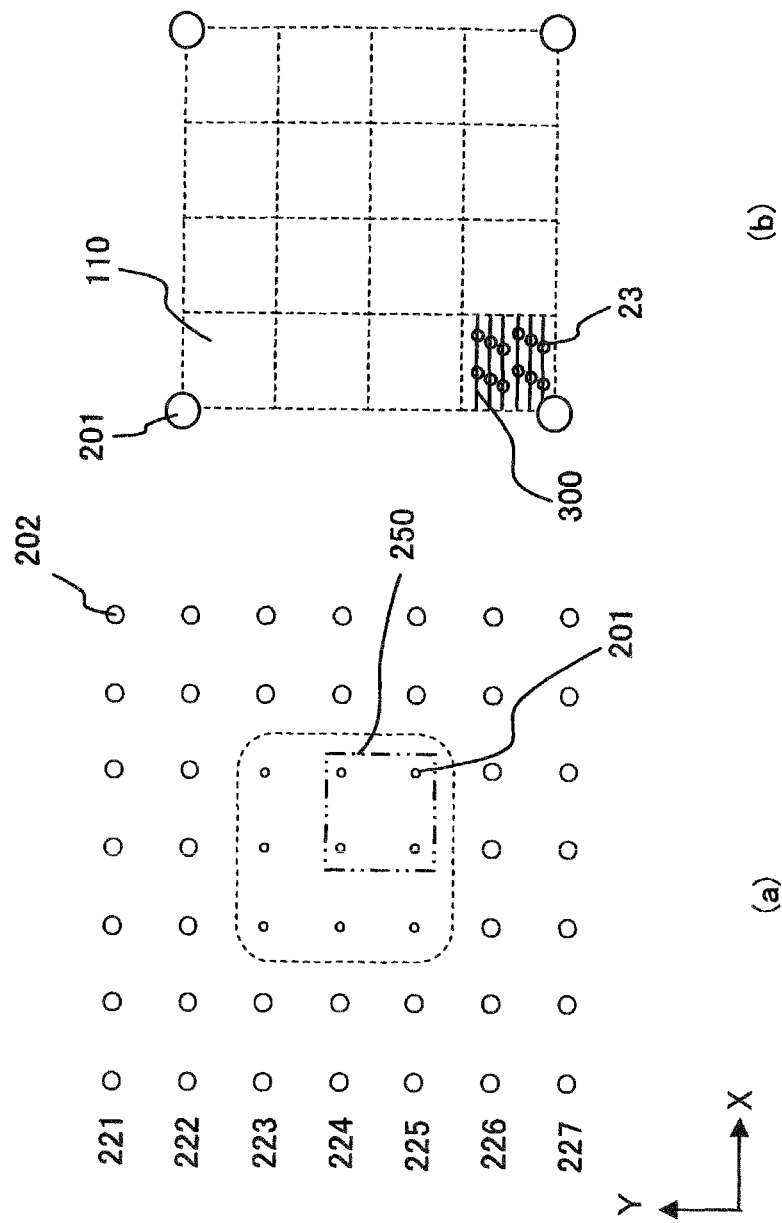
FIG. 14A schematically illustrates a fixing position of the related art fixing frame with a selected area and FIG. 14B is an enlarged view of the selected area.
Figure 15:
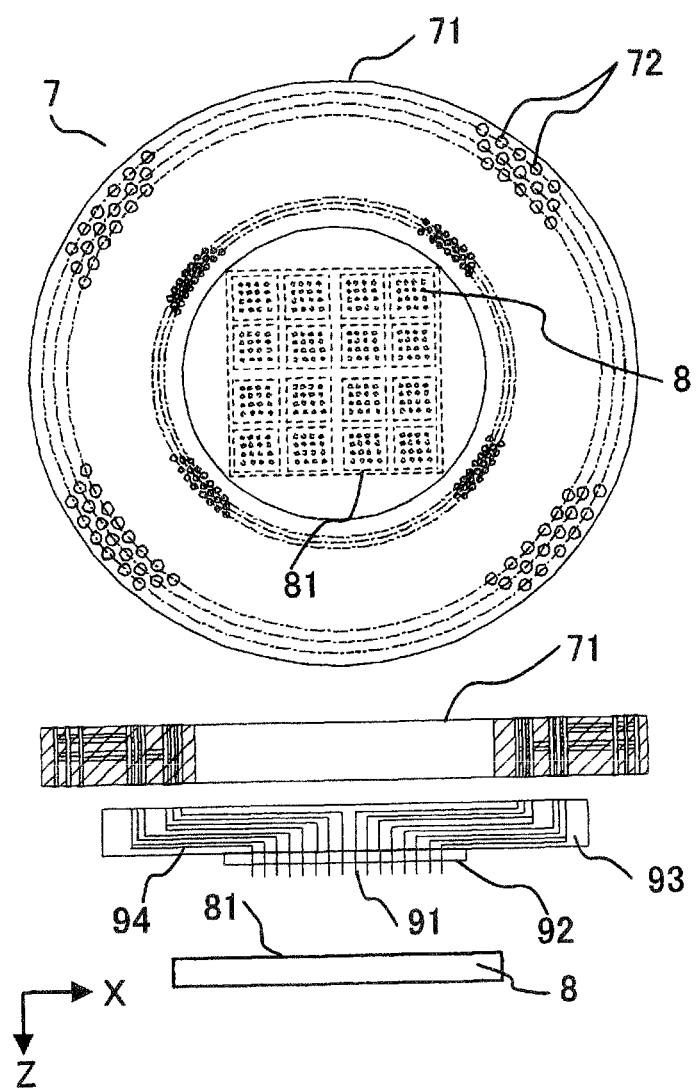
FIG. 15 shows a schematic structure of a related art probe card.

Although the conductive pattern 716 shown in FIG. 5 is formed by etching a copper foil, a resin film with copper foil adhering thereto may also be configured in substantially the same pattern and may thus be extended or contracted according to the probing operation of the copper foil.

The present invention has been described with reference to the preferred embodiments shown in the drawings. However, it will be apparent to those skilled in the art that various changes and modifications can be made without departing from the spirit and scope of the invention.

What is claimed is:

1. An electrical signal connector comprising:
    a resin-made film probe including:
        a resin film with metal foil adhering thereto;
        an elastically deformable probe part formed by etching the metal foil to form a conductive pattern on the resin film,
        a signal input end part formed by one end of the elastically deformable probe part and protruding from one side of the resin film; and,
        a signal output end part formed by another end of the elastically deformable probe part and protruding from an opposite side of the resin film; and
    the connector further comprising:
    a probe unit in which a plurality of resin-made film probes, corresponding to one or more pads on a semiconductor chip to be tested, are supported in parallel on a plurality of support plates;
    a first probe holder of grid structure provided with a plurality of openings; and
    a second probe holder of the same configuration as that of the first probe holder, the second probe holder having projections at intersection points in the grid structure,
    wherein the first and second probe holders are fastened to the circuit board with the projections of the second probe holder inserted in corresponding holes of the circuit board and the first probe holder being fastened to the circuit board with screws; and
    wherein each of the probe units is separately disposed in and fixed to each of the openings and a circuit board is sandwiched between the first probe holder and the second probe holder.

2. The electrical signal connector according to claim 1, wherein no or very little difference exists between an outer diameter of an inserting section of the projection and an inner diameter of the corresponding hole in the circuit board in the vicinity of the center of the circuit board and larger difference exists therebetween in the rest of areas of the circuit board.

3. The electrical signal connector according to claim 1, wherein the difference between an outer diameter of an inserting section of the projection and an inner diameter of the corresponding hole in the circuit board in areas other than the vicinity of the center of the circuit board becomes successively or intermittently larger toward an outer periphery of the circuit board.

4. The electrical signal connector according to claim 1, wherein an operation of the projection in the areas other than the vicinity of the center of the circuit board is not restricted in a surface direction of the circuit board.

5. The electrical signal connector according to claim 1, wherein, in a state in which the probe holders are fixed to the circuit board, the output terminal of the resin-made film probe is pressed against a terminal of the circuit board with force larger than predetermined force and an operation thereof is not restricted in the surface direction of the circuit board.

6. The electrical signal connector according to claim 1, wherein at least the probe holders are made of a material having a thermal expansion coefficient similar to that of a semiconductor wafer.

\* \* \* \* \*